(12) United States Patent (10) Patent No.: US 7,668,412 B2
Lee et al. (45) Date of Patent: Feb. 23, 2010

(54) SYSTEMS AND METHODS FOR DETECTING ELECTRIC DISCHARGE

(75) Inventors: Chung Lee, Austin, TX (US); Kent Kalar, Austin, TX (US)

(73) Assignee: Sensor Tran, Inc, Austin, TX (US)

( * ) Notice: Subject to any disclaimer, the term of this patent is extended or adjusted under 35 U.S.C. 154(b) by 0 days.

(21) Appl. No.: 12/288,663

(22) Filed: Oct. 22, 2008

(65) Prior Publication Data

US 2009/0102489 A1 Apr. 23, 2009

Related U.S. Application Data

(60) Provisional application No. 60/981,765, filed on Oct. 22, 2007.

(51) Int. Cl.
*G02B 6/00* (2006.01)
*G01N 25/00* (2006.01)

(52) U.S. Cl. .................. 385/12; 250/227.18; 374/7

(58) Field of Classification Search ............... 385/12; 374/7, 45, 121, 131, 161; 250/222.18, 372, 250/458.1
See application file for complete search history.

(56) References Cited

U.S. PATENT DOCUMENTS 4,834,496 A 5/1989 Blyler, Jr.
6,500,547 B1 12/2002 Potyrailo
6,965,709 B1 11/2005 Weiss
7,142,291 B2 11/2006 Sarkozi
7,473,906 B2 * 1/2009 Egalon .................... 250/458.1

OTHER PUBLICATIONS

McSherry, Mary; "An Optical Fiber Sensor for the Detection of Germicidal UV Radiation . . ."IEE Sensors Journal vol. 4 No. 5 Oct. 2004.
Muto, Katsutoshi; "Electric-Discharge Sensor Utilizing Fluorescent Optical Fiber." Journal of Lightwave Technology, vol. 7 No. 7 Jul. 1989.
Muhr, M. "Partial discharge behavior of oil board arrangements . . ." XVth International Symposium on High Voltage Engineering. Slovenia; Aug. 27, 2007.

* cited by examiner

*Primary Examiner*—Hemang Sanghavi
(74) *Attorney, Agent, or Firm*—Michael A. Ervin; M A Ervin & Associates

(57) ABSTRACT

A distributed sensing system for detecting partial electric discharge along the length of an extended object or objects. An optical fiber having a cladding integrated with luminescent material and a silica core of less than 500 micro-meters in diameter with a first reflective end deployed in proximity to test objects. A photo detector is positioned at the second end of the optical sensing fiber and receives and measures both a direct emission light from an electric partial discharge event and the reflected emission light from the reflection end of the optical sensing fiber. The measured signals and their arrival times are used to determine the location and magnitude of a partial electrical discharge.

8 Claims, 7 Drawing Sheets

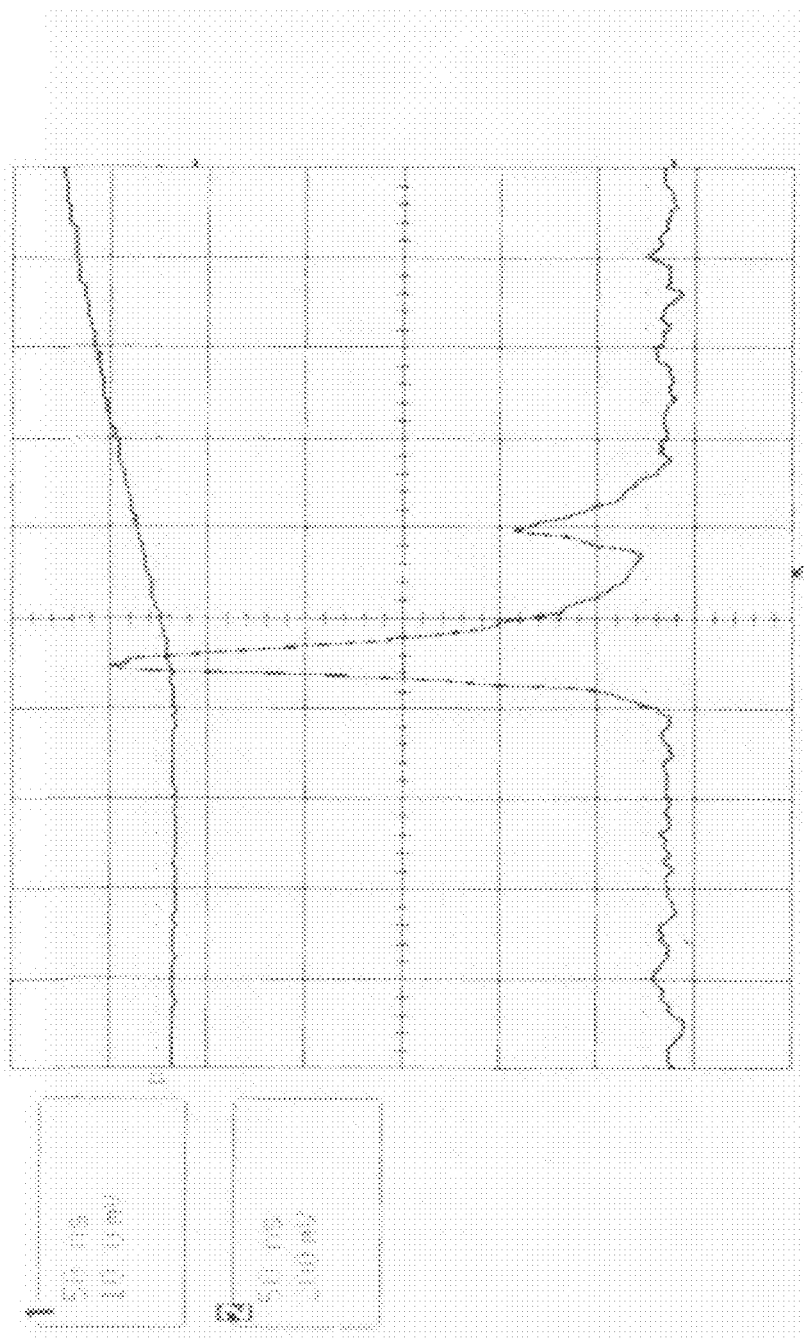

SYSTEMS AND METHODS FOR DETECTING ELECTRIC DISCHARGE

CROSS REFERENCE TO RELATED APPLICATIONS

This application claims the benefit of U.S. Provisional Ser. No. 60/981,765, filed Oct. 22, 2007 by the present inventors.

BACKGROUND

The present disclosure relates to electric partial discharge detection, and more particularly, to a system and method for detection and measuring electric partial discharge using an optical fiber.

As electrical wires age, insulation may become brittle and crack leading to arcing or shorts. Small arcs can carbonize the insulation, leading to bigger arcs and the potential for fire. Control of electrical discharge is necessary to avoid degrading the insulation in electrical wires in air or in insulating oil. The need for reliable monitoring is increased when the cable is used in high altitude where ambient pressures may be well below one atmosphere such at flight altitudes. The inception level for discharges is reduced as pressure decreases. Therefore, intermittent partial discharge or arcing that can occur in flight may not be reproducible during ground maintenance.

Intermittent discharges can occur from a wire with cracked or faulty insulation. Such partial discharges are in the form of pulses having time durations as short as a few nanoseconds or less. The pulses form because, once a discharge initiates, electrons quickly become depleted in the gap by buildup of space charge between the electrodes.

This extinguishes the discharge until the space charge dissipates sufficiently for a fresh discharge to occur. The presence of residual space charge along with surface charges and meta-stable excited gases act as a memory thus affecting ensuing pulse amplitudes and times of onset. Such discharges create an avalanche of electrons whose collisions with nitrogen molecules in air produce spectrum from near-UV photons to visible as shown in FIG. 1.

In order to detect the presence of cable defects in air or in oil, various imaging systems or electrical reflectometry techniques have been used to monitor entire wiring systems. But these devices provide limited coverage or require direct electrical connection, which can be inconvenient or even unsafe in some applications.

One potential detection concept that has been reported is photoluminescence. Photoluminescence is the emission of near or visible light from any substance under external excitation and it can be categorized into fluorescence and phosphorescence. The emission rates of fluorescence are typically $10^8$/sec and its lifetime is near 10 nsec. Phosphorescence is emission of light from triplet-excited states, in which the electron in an excited orbital has the same spin orientation as the ground state electron. The transitions to ground are forbidden and the emission rates are slow ($10^3$-$10^0$), so phosphorescence lifetimes are typically milliseconds to seconds.

When an electron is excited to an upper state, it decays non-radiatively to a lower meta-stable state. From this meta-stable state the, electron decays radiatively emitting a photon. The energy of the emission, which is described as $E=h\nu$ (where h is Plancks constant and $\nu$ is the frequency of the light) is typically less than that of absorption.

Sarkozi, U.S. Pat. No. 7,142,291, proposed a system for detecting partial discharges in wiring using a fluorescence optical fiber. The system required large diameter plastic core fiber optic cables embedded into the insulation material surrounding the wiring. The large core diameter optical fiber had a fluorescent material incorporated into the fiber core. Upon exposure of that fluorescent material to a discharge frequency it generates light that travels in both directions in the optical fiber. Optical detectors at each end of the fiber record the arrival of that light and a processor calculates a location of the discharge from the arrival times.

McSherry, et. al. (IEEE Sensors Journal October 2004) proposed a coated sensor model for measuring germicidal UV irradiation in which a large core diameter plastic optical fiber had its cladding removed and replaced by a fluorescent coating. When placed near a UV lamp the fluorescent coating would generate light that would travel down the optical fiber core to be detected.

Both of these prior art systems made use of large (1000 micro-meter) core diameter plastic optical fibers. Plastic fibers usually have cores of polymethylmethacrylate (PMMA) and typically have core diameters close to 1000 micro-meters. Such fibers have a limited transmission distance and poorer resistance to environmental conditions than optical fibers of a silica (glass) core. Silica glass core fibers typically have silica cores of between 50-500 micro-meters. Thus the plastic core fibers of these prior art references are significantly limited to very short sensor systems (around 10 m range) in favorable environments. In addition less complex detection systems than the two optical detector system of Sarkozi are needed. A silica core based sensor system with a hard plastic cladding for electric partial discharge would enable sensor systems based on large distances (potentially up to 1 kilometer with attenuation of less than 1 dB/100 m at the 550 nm emission band) and in more stringent environmental conditions.

In addition there is a need is for a distributed system that is easily deployable in close proximity to the objects being monitored without the need to incorporate them into the structural design as in the Sarkozi reference. And there is a need to decrease bend related attenuation in the fibers, which is possible with much smaller (<500 micro-meter) core diameter fibers with silica cores.

SUMMARY OF THE INVENTION

One aspect of the invention is a distributed sensing system for detecting partial electric discharge along the length of an extended object or objects on which a single line of silica core optical sensing fiber is deployed in close proximity comprising: a optical sensing fiber comprising: a silica core; a cladding surrounding the core; wherein a luminescent material is integrated into the cladding surrounding the core; and wherein the luminescent material is selected to interact with the photons of any electric discharge so that the photons are converted to near UV to visible light when exposed to electric discharge of the extended object or objects; and wherein the optical sensing fiber is coated at a first end to provide a mirror reflecting surface for any specific emission light; and wherein a transparent protection layer is coated over the cladding; and wherein the silica core of the optical sensing fiber is less than 500 micro-meters in diameter; a photo detector positioned at a second end of the optical sensing fiber for receiving and measuring a first emission light from an electric partial discharge event and a second emission light reflected from the first end of the optical sensing fiber; a signal processor for receiving outputs from the photo detector for determining electric discharge location and magnitude.

In another aspect of the instant invention there is a method for detecting, locating, and measuring electric discharge along the length of an extended object or objects on which a single line of optical sensing fiber is deployed in close proximity comprising the steps of: providing an optical sensing fiber comprising a core, and a cladding surrounding the core, providing a reflecting finish on a first end of the optical sensing fiber; providing a luminescent material integrated into the cladding surrounding the core; the luminescent material selected to interact with electric discharge so that photons from the electric discharge are converted to near UV and visible light; deploying the optical sensing fiber in proximity to the extended object or objects; collecting emission light from the optical sensing fiber at a second end of the optical sensing fiber; providing a photo detector at the second end of the optical sensing fiber to measure intensities and arrival times of the emission light; providing the outputs from the photo detectors to a signal processor and the signal processor then utilizes the photo detector outputs to determine electric discharge location and magnitude.

In another aspect of the instant invention the luminescent material is integrated in the optical sensing fiber by uniformly integrating it into the entire length of the cladding of the optical sensing fiber.

In another aspect of the instant invention the integration of luminescent material is achieved by removing the cladding surrounding the core at discrete locations on the core and replacing it with the luminescent material and a coating of a transparent protection layer.

In another aspect of the instant invention outputs from the photo detector are fed to the signal processor and used to locate the electric discharge source along the fiber by determining the time difference between the first emission light from an electric partial discharge event and a second emission light reflected from the first end of the optical sensing fiber.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 4A shows a graph indicating detected electric partial discharge, in accordance with embodiments of the present disclosure.

DETAILED DESCRIPTION

Preferred embodiments and their advantages are best understood by reference to FIGS. 1 through 5, wherein like numbers are used to indicate like and corresponding parts.

The present disclosure provides systems and methods for safe and continuous monitoring of wiring at low pressures by determining both the magnitude and location of wiring discharge. In particular, the present disclosure provides systems and methods for converting the emitted photons into near UV and visible light and detecting the light using fiber optics in a simplified scheme.

In one embodiment, photons generated by the intermittent discharges may be converted to near UV and visible light or other longer wavelength using a suitable fluorophore layer. The photons may interact with the fluorophore layer and subsequent scattered emission from the interaction may be detected and analyzed to characterize the discharges.

Figure 3A:
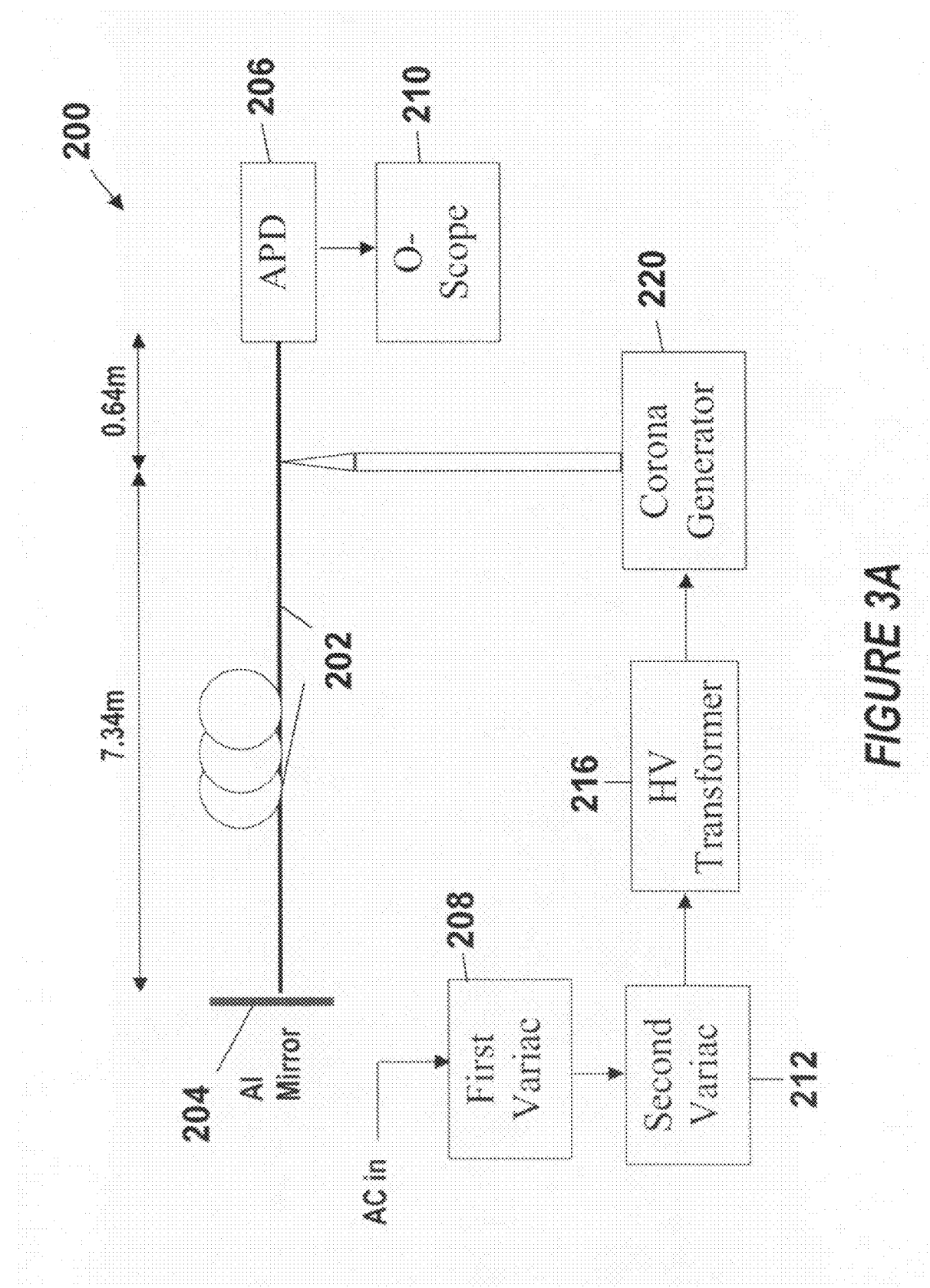
FIG. 3A shows an example system for detecting electric partial discharge, in accordance with embodiments of the present disclosure.

These photons can be converted to near UV and visible light (or longer wavelength) by interacting with a suitable fluorophore layer integrated to the surface (small section 2 mm length) of sensing fiber and the scattered fluorescent light is guided to the photo detector as illustrated in FIG. 3A.

Figure 1:
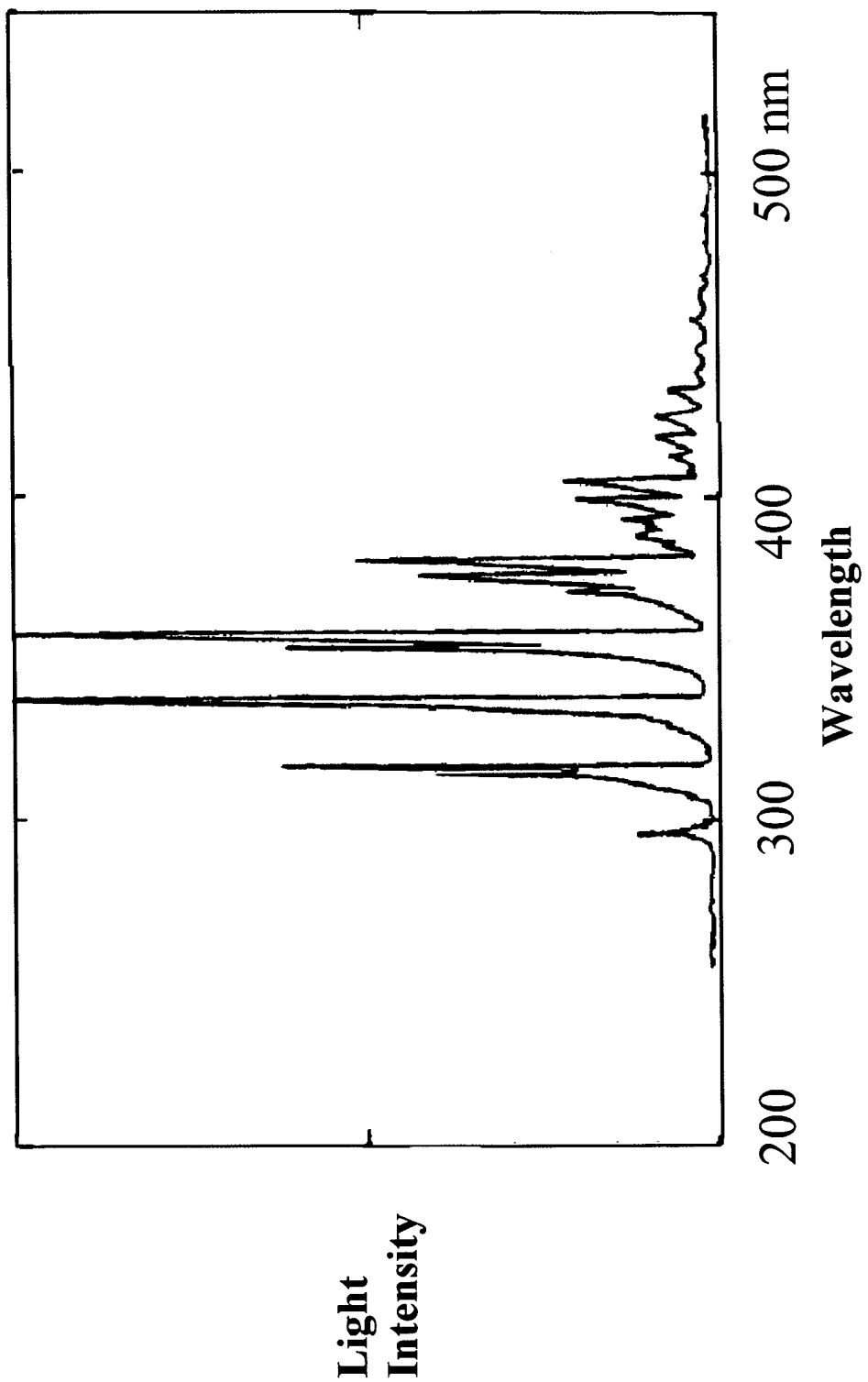
FIG. 1 shows a graph of partial discharge light intensities with respect to wavelengths.
Figure 2:
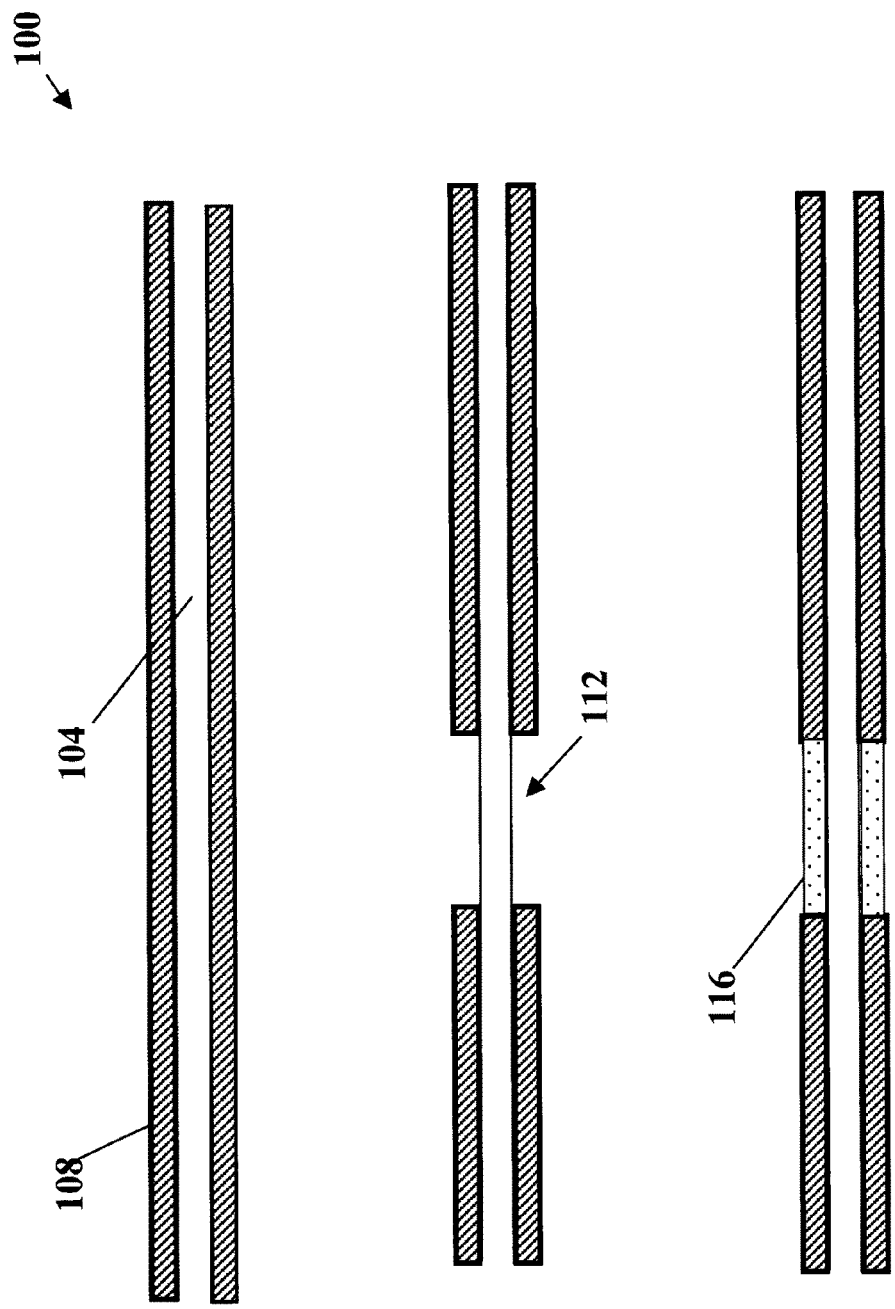
FIG. 2 shows an optical fiber comprising a fluorophore layer, in accordance with embodiments of the present disclosure.

Referring to FIG. 2, an optical fiber 100 having a silica core 104 is surrounded by a cladding 108 with a refractive index less than that of core 104 to maintain a total internal reflection of the propagating light, thus allowing light to traverse the entire length of optical fiber 100 without any significant loss. A fluorophore layer can be created in various ways. In one aspect a section 112 of (jacket, which is not indicated, and) cladding can be removed to expose core. A fluorophore layer 116 can then be coated into that sensing section. Alternately a fluorophore material could be completely integrated (or doped) into the cladding along the complete length of fiber. The instant invention anticipates either of these approaches. After any fluorophore layer is applied a transparent protection layer (not shown) is then coated over the cladding and jacket.

Optical fiber 100 may subsequently be placed directly into electrical wiring system or alternatively, may be placed within the vicinity of electrical cable system for detecting electric discharge.

To demonstrate the response of optical fiber 100, an electric partial discharge generating set up can be used, which simulates an electric discharge from an electrical cable system.

Referring to FIG. 3A, an example test setup 200 is shown. The system shown in FIG. 3A may include an aluminum (Al) mirror 204, optical fiber 202, an avalanche photodetector (APD) 206, a first 208 and second 212 variac, a high voltage (HV) transformer 216, a corona generator 220 (e.g., electric discharge generator) and an oscilloscope 210 (O-scope). Corona generator 220, coupled to optical fiber 202 can be used to simulate a partial electric discharge from a system that may include any device, component, machinery, or other items having one or more electrical wires.

Figure 4B:
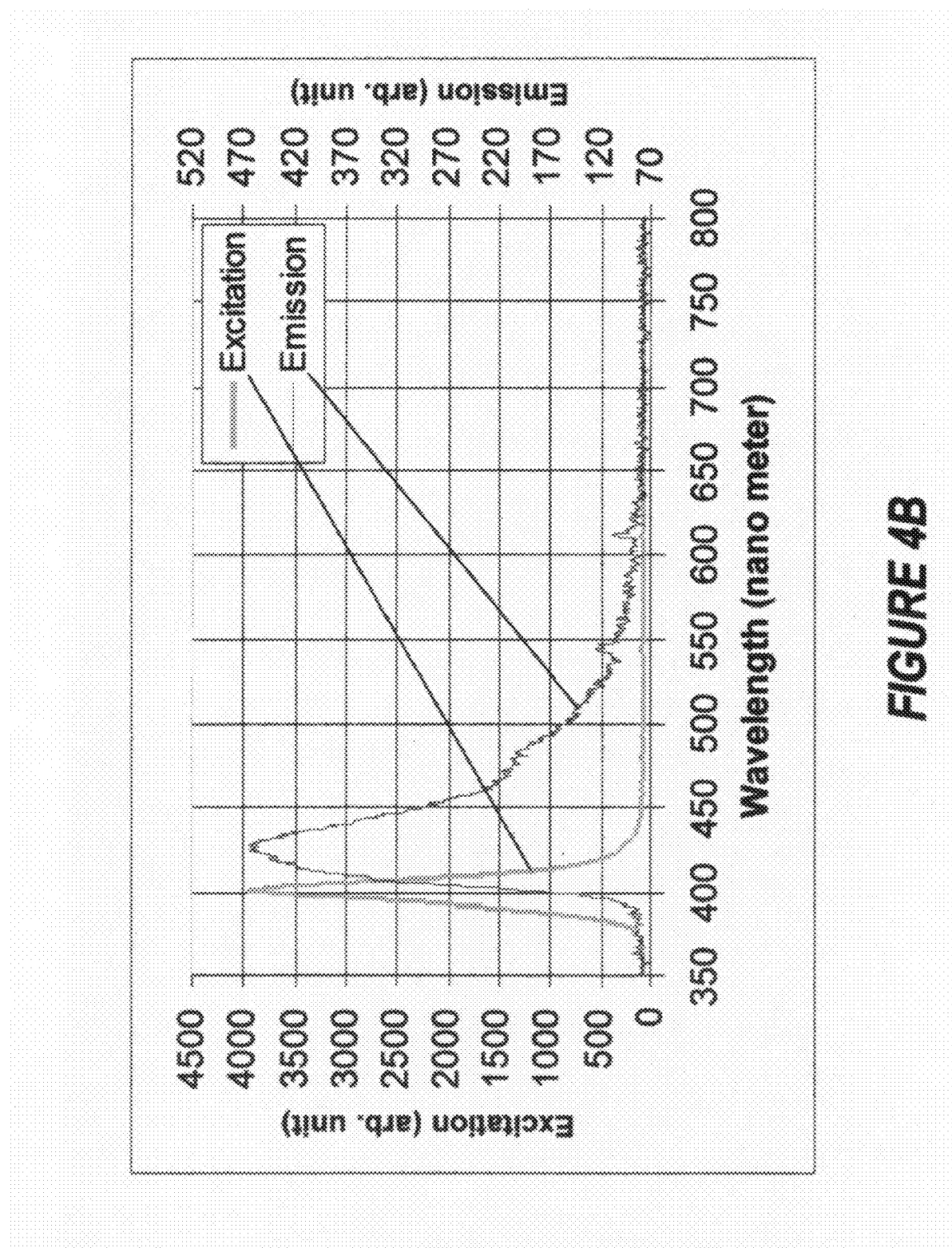
FIG. 4B shows a spectral response of a fluorophore cladding layer, in accordance with embodiments of the present disclosure.

In this experimental example sensing fiber 202 is a hard plastic (polymer cladding), high NA, multimode fiber, which had 200 micro-meter silica core, 220 micro-meter cladding and 500 micro-meter protected jacket. After a section of the jacket and cladding was removed, Coumarin based fluorophore layer was coated on the core for a length of 2 mm. The excitation and emission bands of this fluorophore are shown in FIG. 4B.

The corona generating fixture consists of a sharp and a flat disc electrode which are excited by a high voltage transformer 216 controlled by two cascaded variacs 208, 212. Maximum 15 KV was able to obtain with this setup. The fiber was taped on the flat disc electrode and the distance between the fiber and sharp electrode was set to 5 mm. The far end of the fiber was butt coupled to an Al coated mirror 204 as illustrated in FIG. 3A.

As the voltage approached 8 KV, the corona signal began to appear and its signal grew when the applying voltage was increased. The applied high voltage was stopped at 10 KV for safety reasons, and its response was plotted as in FIG. 4B. Because the captured corona intensity was too weak, it was not discernible under laboratory lightings and it was barely seen after all lightings in the laboratory were turned off.

Temporal responses of consecutive corona signals were very stable and repeatable even though the amplitudes varied slightly. Two peaks in the plot indicate two corona pulses i.e., the first emission light from the partial discharge event is directly guided to the APD and the second emission light is reflected from reflective mirror 204. The location of generated corona can be calculated with Equation (1). The value of 7.34 meters is calculated when manufacturers claimed values of the refractive index and the measurement value between two peaks are 1.457 and 71.5 nsec respectively. The reading error from the plot is around 5 nsec which corresponds to 50 cm. In practice, a commercial system will have either a high-end photo detector system with digital signal out or the signal processor will include an analog/digital input, which will significantly reduce this reading error.

Figure 3B:
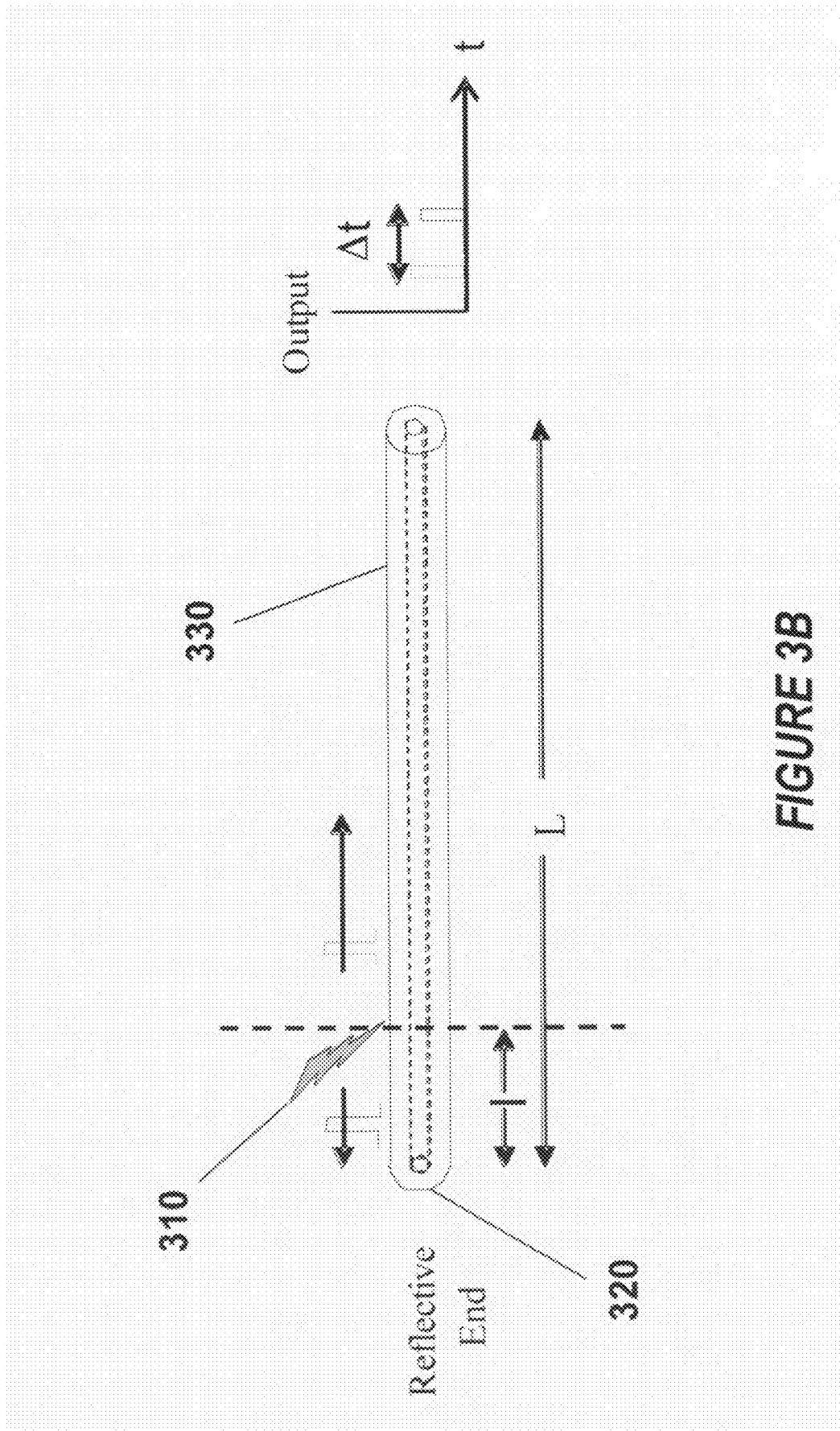
FIG. 3B shows an example for determining a discharge location, in accordance with embodiments of the present disclosure.

FIG. 3B shows an example diagram for the identification of discharge location, in accordance with embodiments of the present disclosure. A partial discharge 310 at a distance I from a first or reflective end 320 of a fiber 330 will produce a first emission light that propagates in both directions along fiber 330. The emission light that strikes the mirror finish at reflective end 320 produces a second emission light that is reflected back down fiber 330. The first and second (reflected) emission lights will arrive at a sensing photo detector (APD 206 of FIG. 3A) at two different measured times. By measuring the difference ($\Delta t$) in their arrival times and known total length of the fiber, L, the location of the discharge on the fiber, I, may be calculated as follows:

$$I = L - (\tfrac{1}{2}) \ast C \ast \Delta t \qquad \text{Eq. 1}$$

where C is the speed of light.

Figure 5:
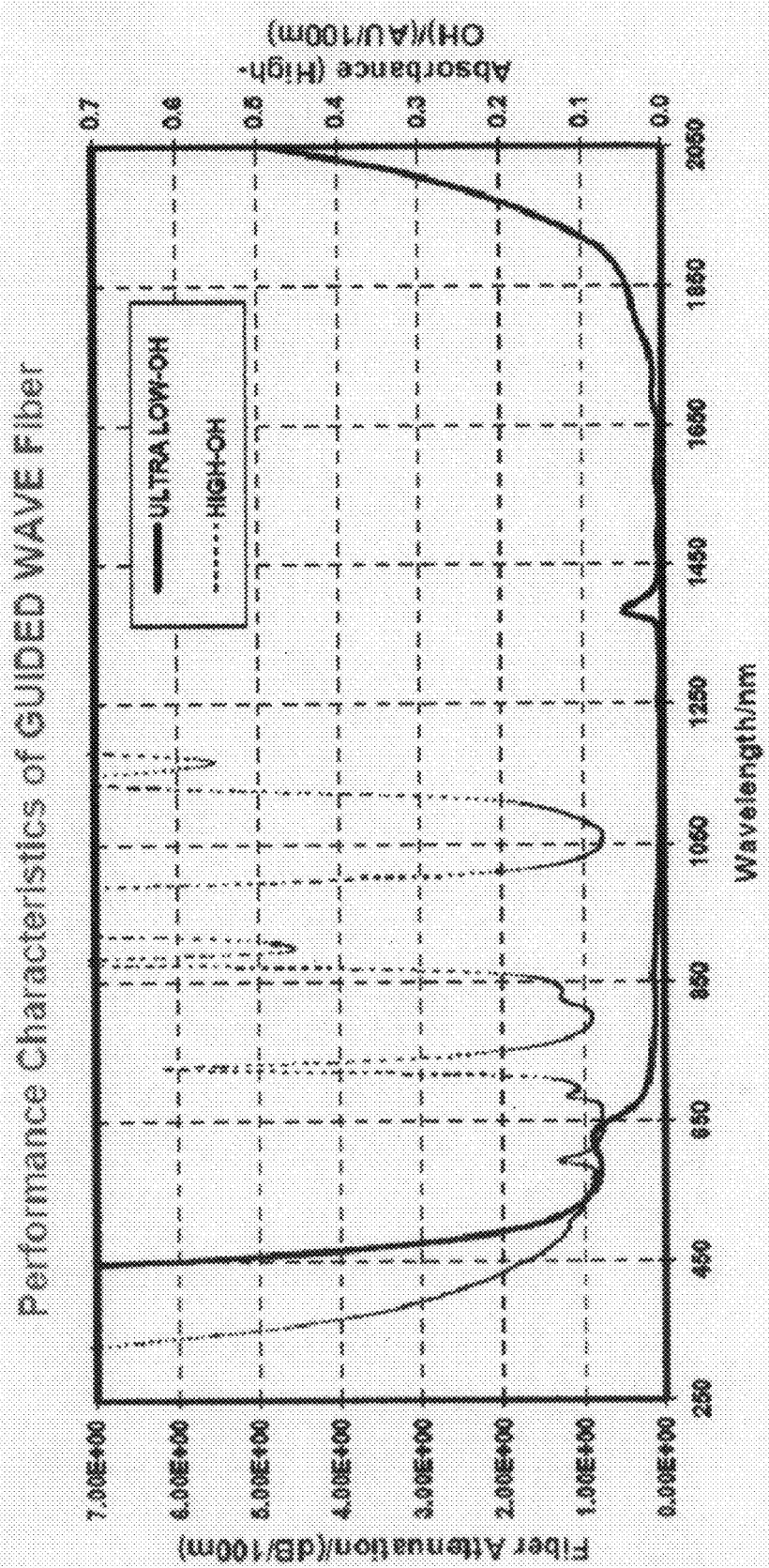
FIG. 5 shows the attenuation profile of a commercially available silica core fiber as a candidate of the sensing fiber in accordance with embodiments of the present disclosure.

FIG. 5 shows lower loss silica core fiber at the emission wavelength of 550 nm. Its attenuation is lower than 1 dB per 100 m, which can extend the sensing range to 1 km with a total attenuation less than 10 dB. If the fluorophore's emission is around 700 nm, the sensing range can be extended further. The core size can be selected from 200 to 600 um.

In summary a fluorophore coated fiber optic partial discharge sensor has been fabricated and the fluorescence emissions generated by electric partial discharges observed. The system provides information for both magnitude and location of the parameters being measured. The most important three features of fluorescent sensing scheme are its passiveness (no light source is necessary i.e., the external discharge light is used as the source), safe operation and the capability of future multiplexed monitoring by fabricating the sensing cladding layers accurately in every meter or less to implement the discrete distributed function. It has been shown that discharge sensing performed by the proposed scheme has significant potential for partial discharge detection in electrical, aerospace and other industrial applications.

Although the present disclosure has been described in detail, it should be understood that various changes, substitutions, and alterations could be made hereto without departing from the spirit and the scope of the invention as defined by the appended claims.

The invention claimed is:

1. A distributed sensing system for detecting partial electric discharge along the length of an extended object or objects on which a single line of silica core optical sensing fiber is deployed in close proximity comprising:
   a. a optical sensing fiber comprising:
      i. a silica core;
      ii. a cladding surrounding said core;
      iii. wherein a luminescent material is integrated into the cladding surrounding said core;
      iv. and wherein said luminescent material is selected to interact with the photons of any electric discharge so that the photons are converted to near UV to visible light when exposed to electric partial discharge of said extended object or objects;
      v. and wherein said optical sensing fiber is coated at a first end to provide a mirror reflecting surface for any specific emission light;
      vi. and wherein a transparent protection layer is coated over the cladding;
      vii. and wherein said silica core of said optical sensing fiber is less than 500 micro-meters in diameter.
   b. a photo detector positioned at a second end of said optical sensing fiber for receiving and measuring a first emission light from an electric partial discharge event and a second emission light reflected from said first end of said optical sensing fiber; and
   c. a signal processor for receiving outputs from said photo detector for determining partial discharge location and magnitude.

2. The distributed sensing system for locating and measuring partial electric discharge of claim 1 wherein said luminescent material in said optical sensing fiber is uniformly integrated into the entire length of the cladding of said optical sensing fiber.

3. The distributed sensing system for locating and measuring electric partial discharge of claim 1 wherein said cladding surrounding said core is removed at discrete locations on the core and replaced with said luminescent material and transparent protection layer.

4. The distributed sensing system for locating and measuring electric discharge of claim 1 wherein outputs from said photo detector is fed to said signal processor and used to locate the electric discharge source along the fiber by determining the time difference between said first emission light from an electric partial discharge event and a second emission light reflected from said first end of said optical sensing fiber.

5. A method for detecting, locating, and measuring electric discharge along the length of an extended object or objects on which a single line of optical sensing fiber is deployed in close proximity comprising the steps of:
   a. providing an optical sensing fiber comprising a core, and a cladding surrounding said core,
   b. providing a reflecting finish on a first end of said optical sensing fiber;
   c. providing a luminescent material integrated into the cladding surrounding said core; said luminescent material selected to interact with electric discharge so that photons from said electric discharge are converted to near UV and visible light;
   d. deploying said optical sensing fiber in proximity to said extended object or objects;
   e. collecting emission light from said optical sensing fiber at a second end of said optical sensing fiber;
   f. providing a photo detector at said second end of said optical sensing fiber to measure intensities and arrival times of said emission light;
   g. providing the outputs from said photo detectors to a signal processor and the signal processor then;

h. utilizes the photo detector outputs to determine electric discharge location and magnitude.

6. The method for detecting, locating, and measuring electric discharge along the length of an extended object or objects of claim 5 wherein said step of providing a luminescent material integrated into the cladding surrounding said core is done by uniformly integrating said luminescent material into the entire length of the cladding of said optical sensing fiber.

7. The method for detecting, locating, and measuring electric discharge along the length of an extended object or objects of claim 5 wherein said step of providing a luminescent material integrated into the cladding surrounding said core is done by removing cladding at discrete locations on the core and replacing with said luminescent material and a transparent protection layer.

8. The method for detecting, locating, and measuring electric discharge along the length of an extended object or objects of claim 5 wherein said step of utilizing the photo detector outputs to determine electric discharge location and magnitude comprises the steps of:

a. receiving and recording the magnitude and time of arrival of a first emission light from an electric partial discharge event;

b. receiving and recording the magnitude and time of arrival of a second emission light reflected from said first end of said optical sensing fiber;

c. calculating the location of the partial electric discharge by determining the time difference between said first emission light from an electric partial discharge event and a second emission light reflected from said first end of said optical sensing fiber and computing the location based on the fiber length.

* * * * *